Figure 1:
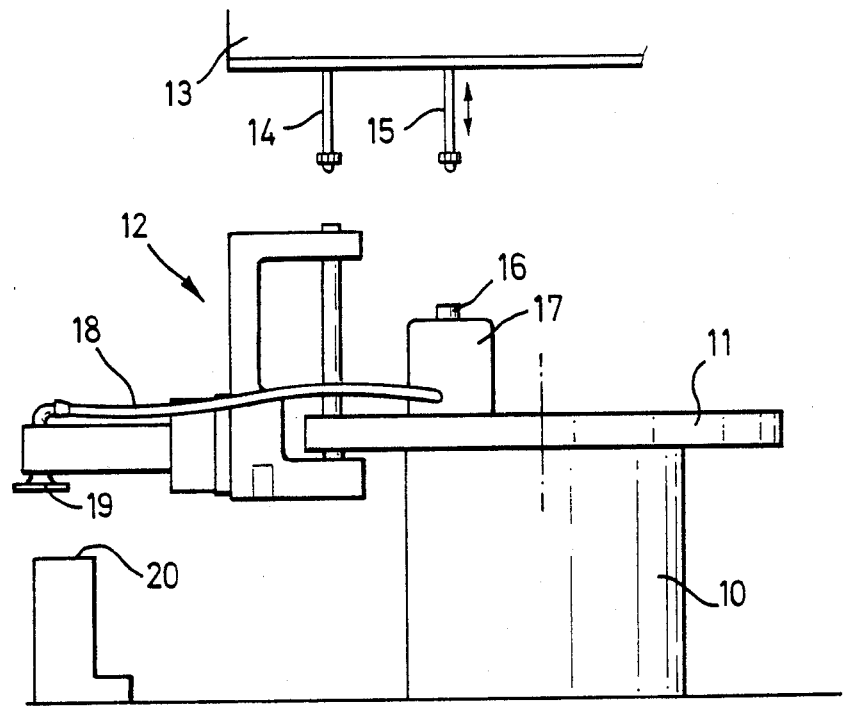

United States Patent [19]

Ciniglio

[11] Patent Number: 4,832,247
[45] Date of Patent: May 23, 1989

[54] SOLDERING APPARATUS

[75] Inventor: Alexander J. Ciniglio, Holly Lodge, Great Britain

[73] Assignee: Evenoak Limited, Witham, Great Britain

[21] Appl. No.: 243,785

[22] Filed: Sep. 13, 1988

[30] Foreign Application Priority Data

Sep. 18, 1987 [GB] United Kingdom ............... 8722057

[51] Int. Cl.⁴ .......................... B23K 1/08; B05C 3/18
[52] U.S. Cl. ........................................ 228/33; 228/36;
228/40; 228/47; 118/423; 269/21; 269/903
[58] Field of Search ....................... 228/33, 35, 36, 37, 228/40, 47; 118/423, 500; 269/903, 21

[56] References Cited

U.S. PATENT DOCUMENTS 3,765,591 10/1973 Cook ....................................... 228/37
4,733,462 3/1988 Kawatani ............................... 269/21

FOREIGN PATENT DOCUMENTS 36744 9/1977 Japan ................................... 118/423
387543 10/1973 U.S.S.R. ............................. 118/423
470558 10/1975 U.S.S.R. ............................. 118/425

Primary Examiner—Nicholas P. Godici
Assistant Examiner—Samuel M. Heinrick
Attorney, Agent, or Firm—Thomas E. Sisson

[57] ABSTRACT

A surface mounted chip soldering apparatus comprises a number of stations for fluxing and soldering the chip. For each station, the chip is carried by a suction pad in which is created a partial vacuum by a respective piston and cylinder mounted on a turret. The piston is upwardly spring biassed and operated in time and in sequence by pneumatically operated pistons to hold and to reject the chips as required for carrying out a soldering sequence.

2 Claims, 1 Drawing Sheet

SOLDERING APPARATUS

The invention relates to soldering apparatus.

There are already many automatic and semi-automatic soldering apparatuses available such as for example described in copending European Application 0234850 in which various components are subjected to fluxing and soldering in sequence by a single apparatus. The present invention relates to such an apparatus which is designed mainly for use in soldering surface mounted chips.

In order to satisfactorily solder such chips the chips must be fluxed and soldered in sequence but the chips require especial arrangements for handling or supporting them suitably for fluxing and soldering. Apparatus according to the invention could however be used for other components having suitable flat upper surfaces.

According to one aspect of the present invention a soldering apparatus for soldering surface mounted chips comprises a fluxing station and a soldering station, a turret having one or more component holders mounted for moving the chips in turn and in sequence to be fluxed and soldered, each component holder comprising a suction pad to press against a top surface of a chip or like component and a relatively movable piston and cylinder pneunmatically connected to the suction pad arranged to create a partial vacuum to hold the chip against the pad while the chip is fluxed and soldered.

According to another aspect of the invention a method of soldering a surface mounted chip comprises dipping one surface of the chip into a molten solder bath, holding the chip surface in the bath for a reasonable period of time, removing the chip surface from the bath and then touching the chip surface into the bath again for a short period of time before removing the chip again.

According to a further aspect of the invention a method of soldering a surface mounted chip comprises moving the chip surface downwards into a moulten solder bath to contact the lower chip surface with the upper surface of the solder for a reasonable period of time, and then moving the chip surface generally sideways out of contact with the solder.

Figure 2:
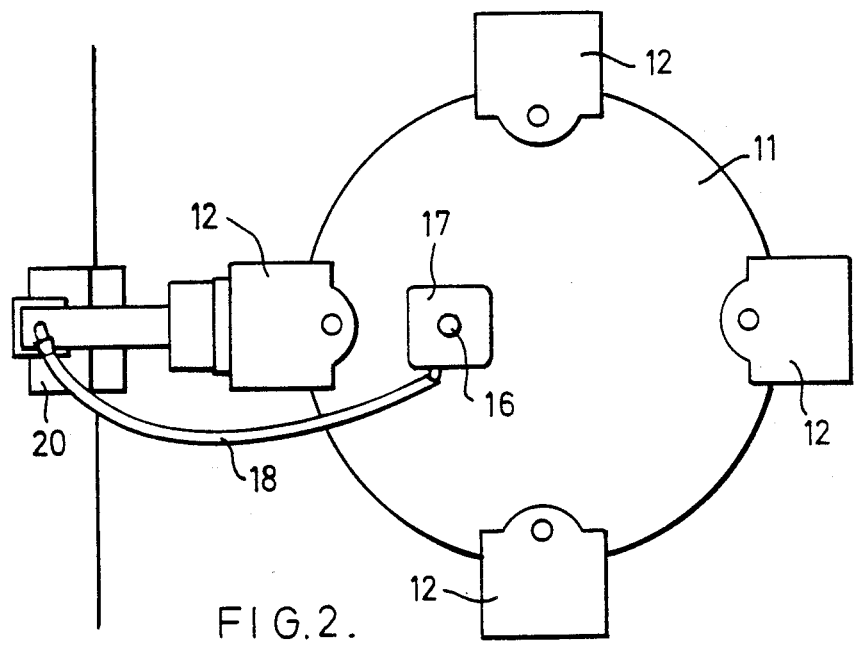

A soldering apparatus and methods according to the invention will now be described by way of example with reference to the accompanying schematic drawings in which:

FIG. 1 is a side elevation of part of the apparatus; and
FIG. 2 is a plan view of part of the apparatus.

The apparatus includes four stations which are positioned equidistant and around a vertical axis of the apparatus. The stations comprise in sequence a component supply station, a fluxing station, a soldering station and a finished component ejecting station. At the stations a component holder (to be described later) reaches down to pick up a component, to flux the component, to solder the component and so on. Fluxing and soldering is carried out by touching the lower surface of the component against the upper surface of a flux bath and moulton solder respectively as required. The component holder is raised and moved in sequence between each station automatically using suitable drive motors and compressed air operated cylinders. The apparatus includes an indexing mechanism of a generally conventional type used for similar automatic apparatuses. The components, surface mounted chips, can be supplied to the feeding station and removed from the ejecting station by conveyor feeds or the like if desired.

Referring to the drawings, in FIGS. 1 and 2 the apparatus comprises a rotatable turret 10 on which is mounted a circular turret plate 11 having four equally spaced component holders 12, only one of which is shown in FIG. 1. Above the turret plate 11 is a console 13 in which are mounted a number of pneumatically operated pistons only two of which 14 and 15 are shown. The component holder 12 is slidably mounted on the turret plate 11 and biassed upwards by a spring (not shown). The holder 12 is moved downwards in use by being pressed down by the piston 14 when that piston is operated.

A spring biassed piston 16 in a cylinder 17 mounted on top of the turret plate 11 is connected by a flexible air line 18 to a suction pad 19. The piston 16 is depressed, as explained below, whenever the piston 15 is operated. A platform 20 is provided at the side of the apparatus onto which a chip to be soldered is placed and forms the feeding station referred to above.

The sequence of operation of the apparatus is as follows:

A chip to be soldered is placed on the platform 20. This may be done by hand or automatically using a conveyor feed (not shown) as preferred. The pistons 14 and 15 are both operated which respectively push down the holder 12 and the piston 16 to exhaust air from at least part of the cylinder 17 via the suction pad 19. The suction pad is pressed against the top surface of the chip by the holder 12 and the piston 15 operated to move upwards away from the piston 16. The piston 16 rises under its spring bias creating a partial vacuum inside the cylinder 17 causing the suction pad 19 to grip the chip. The piston 14 is then moved upwards and so the holder 12 moves upwards due to its spring bias and lifts the chip upwards. The turret 10 is then rotated 90° to bring the chip to a position above a flux bath (not shown).

At the flux bath, the holder 12 is again moved downwards by a suitably positioned piston (not shown) in the console 13 so that the lower surface of the chip contacts the top surface of the flux for fluxing the chip. The holder 12 is then allowed to move upwards and the turret is rotated further or held to allow the flux to be dried off using an infrared heater.

When the holder arrives above the solder bath (not shown), the holder 12 is again pressed down by another suitably positioned piston (not shown) in the console 13 so that the lower surface of the chip contacts the top of the solder. The chip is held in contact with the solder for about one second, lifted away from the solder and then lowered to touch the solder again for about one tenth of a second before being lifted up again by the holder 12.

The holder 12 is then moved a further 90° around the apparatus to an eject station where the piston (not shown), corresponding to the piston 15, is operated to depress the piston 16 so as to at least to release or reduce the vacuum at the suction pad so that the pad falls away into a collection bin (not shown).

The holder 12 is then moved a further 90° around to above the platform 20 to complete the cycle.

The chip is contacted against the solder surface twice in the soldering sequence explained above. The first contact with the solder allows the chip to heat up and its terminals to become coated with solder. When the chip is first removed this coating may be uneven and tend to cause inherent difficulties when the soldered chip is later attached to a circuit board or the like. The second brief contact with solder has the effect of at least reducing any uneveness in the solder coating and of removing other imperfections and solder short-circuit tracks.

The chosen periods of contact are varied according to the size and types of components as well as materials used but suffice it to say that the first contact period is usually about one second, which is the period generally required for similar soldering operations, whereas the second contact period is a very short period comparatively and takes place within a similar very short or fairly short period of time after the end of the first contact period.

In an alternative method, the chip is not contacted a second tme with the solder bath but is removed generally sideways by the apparatus so as to wipe, in effect, the two surfaces together, the lower surface of the chip and the upper surface of a solder bath (usually a flowing solder surface), as those two surfaces separate. As before this has the effect of producing solder coatings on the terminals of the chip which are smooth and even and does not tend to leave local short-circuit tracks.

The piston 16 and cylinder 17 moving relative to one another provide a form of separate vacuum pump for respective of the pads 19. Clearly, the piston 16 could be fixed or anchored on the platform 11 and the cylinder arranged to be biassed upwards and moved by the piston 15 relative to the piston 16. The piston 16 and cylinder 17 could also be replaced by a bellows arrangement which is depressed when required by the piston 15. The throw and speed of movement of the piston 15 can be adjusted to provide different degrees of vacuum at the suction pad 19 to ensure a good gripping of the chip is achieved. This may be varied according to the size and weight of the chip and the degree of smoothness of the top surface of the chip. As already mentioned the suction pads 19 or the like may be used to transport other components for soldering by the apparatus above where the component is picked by using a locally generated partial vacuum created by the piston 16 and cylinder 17 or bellows arrangement or similar mounted on the turret platform 11.

I claim:

1. A soldering apparatus for soldering surface mounted chips comprises a fluxing station and a soldering station, a turret having one or more components holders mounted for moving the chips in turn and in sequence to be fluxed and soldered, each component holder comprising a suction pad to press against a top surface of a chip or like component and a relatively movable piston and cylinder pneumatically connected to the suction pad arranged to create a partial vacuum to hold the chip against the pad while the chip is fluxed and soldered.

2. A soldering apparatus according to claim 1 in which each cylinder is mounted on a top surface of the turret plate and connected to the suction pad by a flexible air line, in which the pistons of each cylinder is spring biassed to move sequentially upwards to create the partial vacuum.

* * * * *